(12) United States Patent
Yasunobe

(10) Patent No.: US 11,073,769 B2
(45) Date of Patent: Jul. 27, 2021

(54) CONVEYANCE APPARATUS, CONVEYANCE METHOD, LITHOGRAPHY APPARATUS, LITHOGRAPHY SYSTEM, AND ARTICLE MANUFACTURING METHOD

(71) Applicant: CANON KABUSHIKI KAISHA, Tokyo (JP)

(72) Inventor: Osamu Yasunobe, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/818,204

(22) Filed: Mar. 13, 2020

(65) Prior Publication Data

US 2020/0310257 A1 Oct. 1, 2020

(30) Foreign Application Priority Data

Mar. 26, 2019 (JP) .............................. JP2019-058566

(51) Int. Cl.
*G03F 7/20* (2006.01)
*G03B 27/52* (2006.01)

(52) U.S. Cl.
CPC ................................ *G03F 7/70716* (2013.01)

(58) Field of Classification Search
CPC . H01L 51/56; H01L 51/0072; H01L 51/0073; H01L 51/5016; H01L 51/0096; H01L 23/467; H01L 33/32; H01L 21/68785; H01L 21/6719; H01L 21/67028; H01L 21/68714; H01L 21/68764; H01L 21/02041; G03F 7/70716; G03F 7/0002; G03F 7/70916; G03F 7/70933; G03F 7/7075; C23C 14/564; C23C 16/4412; C23C 16/02; C23C 16/4584; C23C 16/0227; C23C 14/022; C23C 16/4401; C23C 14/505; C23C 21/304; C23C 14/021

See application file for complete search history.

(56) References Cited

U.S. PATENT DOCUMENTS 5,916,374 A * 6/1999 Casey ................... B41F 35/005
134/37
2006/0169207 A1 8/2006 Kobayashi
2008/0218712 A1 * 9/2008 Compen ............. G03F 7/70925
355/30

FOREIGN PATENT DOCUMENTS

JP 2006216710 A 8/2006

* cited by examiner

*Primary Examiner* — Mesfin T Asfaw
(74) *Attorney, Agent, or Firm* — Rossi, Kimms & McDowell LLP

(57) ABSTRACT

A conveyance apparatus that is advantageous in terms of productivity is provided. The conveyance apparatus includes a holding unit configured to hold and convey a substrate, and an outlet unit which is disposed in the holding unit and includes a first outlet port configured to blow a gas in a first direction, which is a direction oblique to a first surface of the substrate held by the holding unit, toward the first surface.

16 Claims, 8 Drawing Sheets

CONVEYANCE APPARATUS, CONVEYANCE METHOD, LITHOGRAPHY APPARATUS, LITHOGRAPHY SYSTEM, AND ARTICLE MANUFACTURING METHOD

BACKGROUND OF THE INVENTION

Field of the Invention

The present invention relates to a conveyance apparatus, a conveyance method, a lithography apparatus, a lithography system, and an article manufacturing method.

Description of the Related Art

In a lithography process included in a manufacturing process of articles such as semiconductor devices or micro electro mechanical systems (MEMS), an imprint apparatus forms an uncured resin supplied on a substrate with a mold and forms a resin pattern on the substrate. For example, in an imprint apparatus employing a photocuring method, first, an uncured resin (an imprint material, a photocurable resin, or an ultraviolet curable resin) is supplied (applied) to a shot which is an imprint region on a substrate. Next, the resin is molded using a mold. Then, light (ultraviolet light) is radiated to cure the resin and then separates the mold, thereby forming a resin pattern on the substrate. In such an imprint apparatus, in order to improve productivity, there is a cluster type lithography system including a plurality of imprint apparatus and a substrate conveyance apparatus which moves between the plurality of imprint apparatus and supplies substrates.

In recent semiconductor devices, such a cluster type lithography system also requires more strict control of particles and chemical contamination as patterns become finer due to high integration of integrated circuits. Japanese Patent Laid-Open No. 2006-216710 discloses a technique for preventing particles from adhering to a substrate that is being conveyed by flowing a gas substantially parallel to a surface of the substrate.

In Japanese Patent Laid-Open No. 2006-216710, since the gas flows substantially parallel to the surface of the substrate, a laminar flow along the substrate is not easily formed, and turbulence occurs on a processing target surface of the substrate, which may draw a surrounding atmosphere thereinto. In this case, there is a concern that particles and the like entrained in the turbulence may adhere to the processing target surface of the substrate, which may lower, in a subsequent imprint process, precision of a pattern formed on the substrate, thereby decreasing productivity.

SUMMARY OF THE INVENTION

For example, an object of the present invention is to provide a conveyance apparatus which is advantageous in terms of improving productivity.

A conveyance apparatus according to one aspect of the present invention includes a holding unit configured to hold and convey a substrate, and an outlet unit which is disposed in the holding unit and includes a first outlet port configured to blow a gas in a first direction that is a direction oblique to a first surface of the substrate held by the holding unit toward the first surface.

Further features of the present invention will become apparent from the following description of exemplary embodiments with reference to the attached drawings.

DESCRIPTION OF THE EMBODIMENTS

Figure 1:
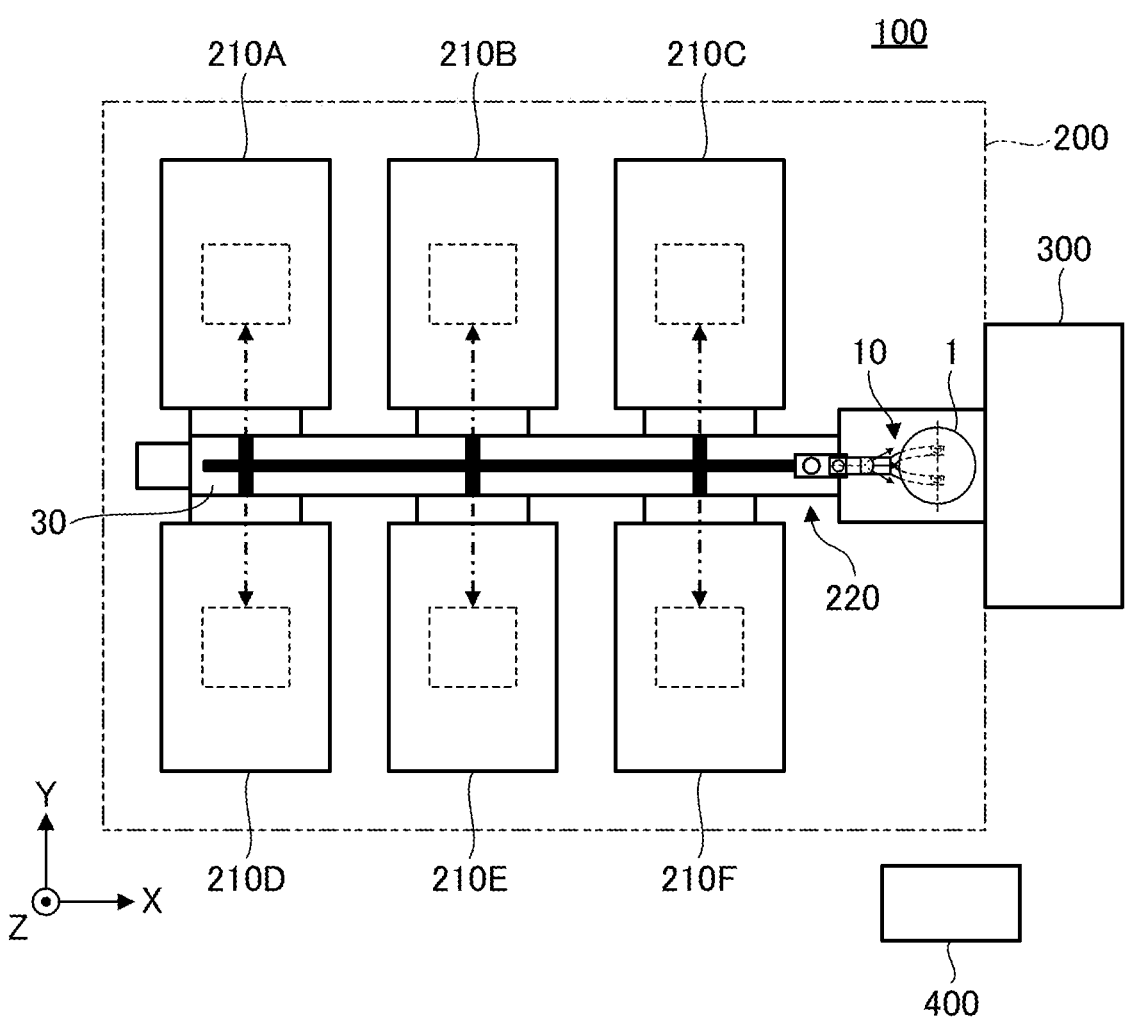
FIG. 1 is a schematic plan view showing a configuration of a processing system including a cluster type processing apparatus according to a first embodiment.

Hereinafter, exemplary embodiments of the present invention will be described in detail with reference to the accompanying drawings. In addition, in each of the drawings, the same members or elements are denoted by the same reference numerals, and repeated descriptions will be omitted. Further, although an imprint apparatus that forms a pattern of an imprint material on a substrate using a mold will be described as a processing apparatus in the following embodiments, the processing apparatus is not limited thereto. For example, the present invention can be applied to a lithography apparatus such as an exposure apparatus that exposes a substrate and conveys a mask pattern to the substrate, and a drawing apparatus that irradiates a substrate with a charged particle beam to form a pattern on the substrate.

An imprint apparatus is a device that forms a pattern of a cured product on which an uneven pattern of a mold is conveyed by bringing an imprint material supplied on a substrate into contact with the mold and applying energy for curing to the imprint material. That is, the imprint apparatus is used for manufacturing a semiconductor device or the like, and performs an imprint process of forming a pattern on an imprint material supplied on a substrate using a mold on which an uneven pattern is formed. For example, the imprint apparatus cures an imprint material in a state in which a mold on which a pattern has been formed is in contact with the imprint material on a substrate. Then, the imprint apparatus can widen a gap between the mold and the substrate and separate (release) the mold from the cured imprint material, thereby forming the pattern on the imprint material.

As the imprint material, a curable composition (which may be referred to as an uncured resin) that is cured by applying energy for curing thereto is used. As the energy for curing, electromagnetic waves, heat, and the like are used. The electromagnetic waves are, for example, light of which a wavelength is selected from a range of 10 nm or more and 1 mm or less, such as infrared light, visible light, and ultraviolet light.

The curable composition is a composition that is cured by radiating light or by heating. Among the above, a photocurable composition which is cured using light contains at least a polysynthetic compound and a photopolymerization initiator, and may contain a non-polysynthetic compound or a solvent as necessary. The non-polysynthetic compound is at least one selected from the group consisting of a sensitizer, a hydrogen donor, an internal release agent, a surfactant, an antioxidant, a polymer component, and the like.

The imprint material is applied in a film shape on the substrate by a spin coater or a slit coater. Alternatively, it may be applied to the substrate using a liquid ejecting head in a droplet shape, or an island shape or a film shape formed by connecting a plurality of droplets. A viscosity (viscosity at 25° C.) of the imprint material is, for example, 1 mPa·s or more and 100 mPa·s or less.

First Embodiment

First, a lithography apparatus according to a first embodiment of the present invention will be described. Although the lithography apparatus according to the present embodiment will be described using a so-called cluster type processing apparatus having a plurality of processing units, the present invention can also be applied to a lithography apparatus such as an imprint apparatus, an exposure apparatus, and a drawing apparatus having only one processing unit. Also, FIG. 1 is a schematic plan view showing a configuration of a processing system 100 (a lithography system) including a cluster type processing apparatus 200 (a lithography apparatus) according to the first embodiment. Further, in the following description, directions orthogonal to each other in a plane along a surface of a substrate 1 on which an imprint material 215 is supplied are defined as an X axis and a Y axis, and a direction perpendicular to the X axis and the Y axis (for example, a direction parallel to an optical axis of ultraviolet light applied to the imprint material) is defined as a Z axis.

The processing system 100 includes the cluster type processing apparatus 200, a pre-processing apparatus 300, and a controller 400. The cluster type processing apparatus 200 includes a plurality of (six as an example in the present embodiment) processing units 210 (210A to 210F) and a conveyance unit 220.

Each of the plurality of processing units 210 performs an imprint process of forming a pattern of the imprint material 215 on the substrate 1 using a mold 2. A detailed configuration of the processing unit 210 will be described later.

The conveyance unit 220 conveys the substrate 1 on which pre-processing has been performed by the pre-processing apparatus 300 to each of the plurality of processing units 210. The conveyance unit 220 can include, for example, the holding unit 10 that holds the substrate 1 and a conveying path 30 in which the holding unit 10 moves.

The pre-processing apparatus 300 performs pre-processing on the substrate 1 on which the imprint process is performed. The pre-processing performed by the pre-processing apparatus 300 may include, for example, a process of forming on the substrate 1 an adhesion layer for improving adhesion between the substrate 1 and the imprint material 215 supplied thereon.

The controller 400 is configured of, for example, a computer having a CPU, a memory, and the like, and controls each unit of the processing system 100.

Figure 2:
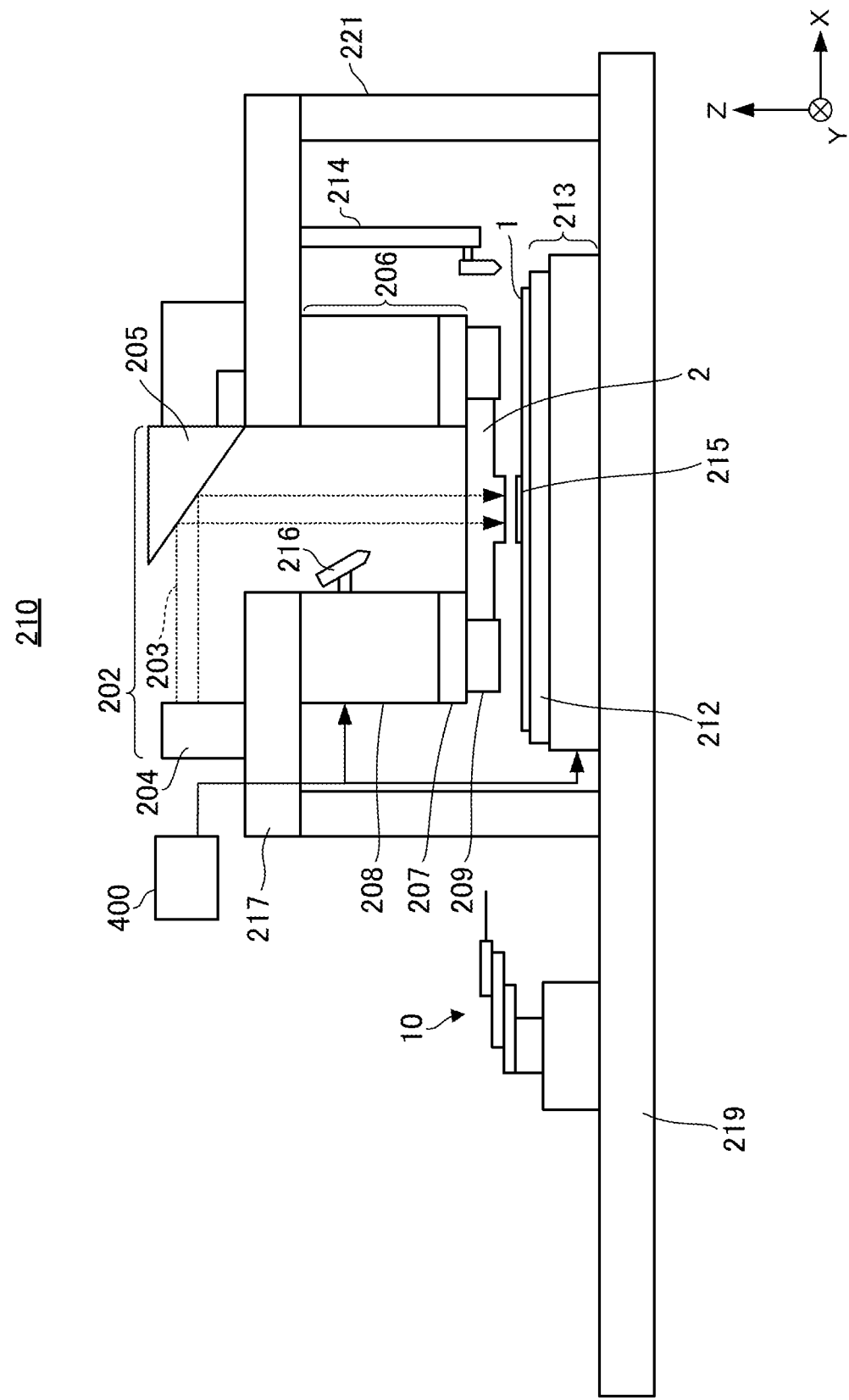
FIG. 2 is a schematic diagram showing a configuration of one processing unit.

Next, a configuration of the processing unit 210 will be described with reference to FIG. 2. FIG. 2 is a schematic diagram showing a configuration of one processing unit 210.

The processing unit 210 includes, for example, a curing unit 202, an imprint head 206 that holds the mold 2, a substrate stage 213 that holds the substrate 1, a supply unit 214, and an alignment measurement unit 216. The processing unit 210 performs the imprint process of forming the pattern of the imprint material 215 on the substrate using the mold 2.

The curing unit 202 includes, for example, a light source 204 and a plurality of optical systems 205 for modulating ultraviolet light 203 emitted from the light source 204 to light which is suitable for imprint.

The mold 2 is a mold that has, for example, a rectangular outer peripheral portion and includes a pattern region in which an uneven pattern to be formed on the imprint material 215 supplied on the substrate 1 is formed in a three-dimensional shape on an opposing surface facing the substrate 1. Further, the mold 2 is made of a material that transmits ultraviolet light, such as quartz.

The imprint head 206 includes, for example, a mold chuck 207, a mold stage 208, and a mold shape correction mechanism 209. The mold chuck 207 holds the mold 2 using a mechanical holding means (not shown) such as a vacuum suction force and an electrostatic suction force. Also, the mold chuck 207 is held on the mold stage 208 using a mechanical holding means (not shown). The mold stage 208 includes a drive system for positioning a gap between the mold 2 and the substrate 1 when the mold 2 is brought into contact with the substrate 1, and moves the mold 2 in the Z axis direction. Further, the drive system of the mold stage 208 may have, for example, a function of moving the mold 2 not only in the Z axis direction but also in the X axis direction, the Y axis direction, and a θ direction (a rotation direction around the X axis, around the Y axis, and around the Z axis). The mold shape correction mechanism 209 is a mechanism for correcting a shape of the mold 2 and is installed at a plurality of locations to surround the outer peripheral portion of the mold.

The substrate stage 213 holds the substrate 1 and corrects (aligns) a translation shift between the mold 2 and the substrate 1 when the mold 2 is brought into contact with the substrate 1. The substrate stage 213 includes a substrate chuck 212. The substrate chuck 212 holds the substrate 1 using a substrate suction pad (a substrate suction unit). Also, as a suction method, vacuum suction, electrostatic suction, or another suction method may be used. The substrate stage 213 includes a drive system that is driven in the X axis direction and the Y axis direction for correcting (aligning) a translation shift between the mold 2 and the substrate 1. Also, the drive systems in the X axis direction and the Y axis direction may include a plurality of drive systems such as a coarse drive system and a fine drive system. Further, there may be a drive system for adjusting a position in the Z axis direction, a function of adjusting a position of the substrate 1 in the θ direction (rotation around the Z axis), and a tilt function for correcting an inclination of the substrate 1. The substrate stage 213 is one of a plurality of holding units.

The substrate 1 can be a member made of glass, a ceramic, a metal, a semiconductor, a resin or the like. If necessary, a layer made of a material different from that of the member may be formed on a surface of the member. The substrate 1 is, for example, a silicon wafer, a compound semiconductor wafer, or a quartz glass plate. A plurality of shot regions are formed on the substrate 1, and a pattern can be formed on the shot region of the substrate 1 by repeating the imprint process for each shot region. The processing unit 210 may further include a base surface plate 219 for holding the substrate stage 213, a bridge surface plate 217 for holding the imprint head 206, and a column 221 for supporting the bridge surface plate 217.

The supply unit 214 (dispenser) supplies the imprint material 215 onto the substrate 1. The supply unit 214 has, for example, a discharge nozzle (not shown), and supplies the imprint material 215 onto the substrate 1 from the discharge nozzle. Also, in the present embodiment, a resin having a property of being cured by ultraviolet light is used as the imprint material 215 as an example. Further, an amount of the imprint material 215 to be supplied may be determined in accordance with a required thickness of the imprint material, a density of a pattern to be formed, and the like.

The alignment measurement unit 216 is a measurement unit for detecting alignment marks formed on the mold 2 and the substrate 1 to measure positional deviations in the X axis direction and the Y axis direction and a difference in shape between the pattern formed on the substrate 1 and the pattern region of the mold 2.

The processing unit 210 performs the imprint process on the substrate 1 conveyed by the conveyance unit 220. The conveyance unit 220 conveys the substrate 1 and performs transfer of the substrate 1 between the inside and the outside of the processing unit 210. For example, the conveyance unit 220 causes the substrate 1 on which the pre-processing has been performed by the pre-processing apparatus 300 to be held by the holding unit 10, and moves the holding unit 10 along the conveying path 30, thereby moving the substrate 1 to a position in front of the processing unit 210 to be conveyed (loaded). Then, the conveyance unit 220 inserts the holding unit 10 holding the substrate 1 into the processing unit 210 and transfers the substrate 1 onto the substrate stage 213.

Figure 3A:
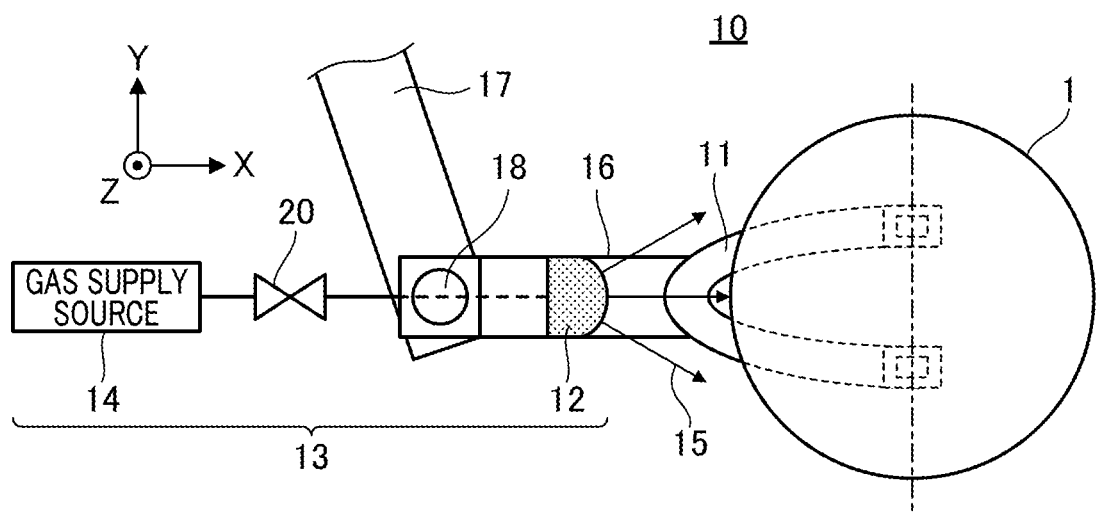
FIGS. 3A and 3B are schematic diagrams showing a configuration of a holding unit according to the first embodiment.
Figure 3B:
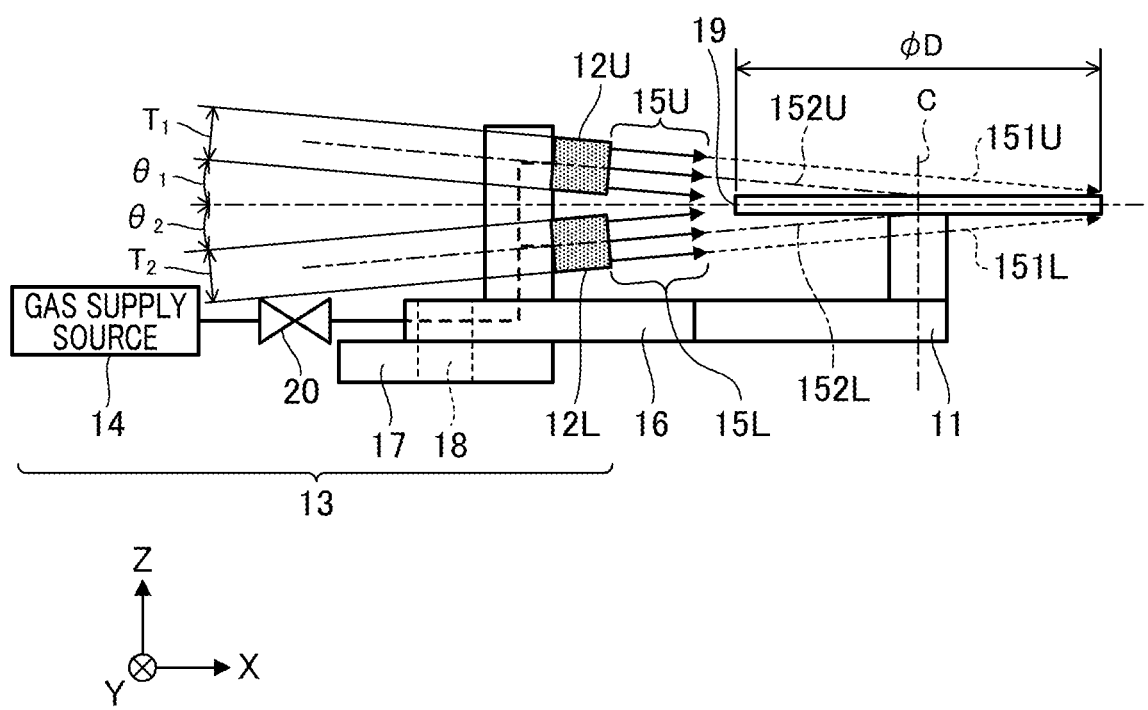

Here, a configuration of the holding unit 10 will be described with reference to FIGS. 3A and 3B. FIGS. 3A and 3B are schematic diagrams showing the configuration of the holding unit 10 according to the first embodiment. FIG. 3A is a plan view when the holding unit 10 is viewed from a +Z direction, and FIG. 3B is a side view when the holding unit 10 is viewed from a −Y direction. The holding unit 10 includes, for example, a hand 11 and an outlet unit 13.

The hand 11 holds the substrate 1. The substrate 1 is placed on the hand 11 substantially horizontally with a processing target surface (a first surface) facing the +Z direction. The hand 11 holds the substrate 1 using, for example, vacuum suction, Coulomb force fixation in which a voltage is applied and the like, or another means. The hand 11 is fixed to, for example, a tip of a first support portion 16. The first support portion 16 is connected to, for example, a second support portion 17 via a rotation shaft 18. Thus, the hand 11 fixed to the tip of the first support portion 16 can rotate with respect to the second support portion 17.

The outlet unit 13 includes, for example, an outlet port 12, a gas supply source 14, and a control valve 20. The outlet port 12 blows a clean gas supplied from the gas supply source 14 from an outer peripheral side of the substrate 1 held by the holding unit 10 toward a surface of the substrate 1 held by the holding unit 10. Also, in the present specification, surfaces of the substrate 1 may include the processing target surface of the substrate 1 and a surface (a second surface) opposite to the processing target surface. The outlet port 12 has a shape in which a gas can be radially blown to the substrate 1 so that the gas supplied from the gas supply source 14 is supplied to the entire surface of the substrate 1. By doing this, reduction in size and weight of the outlet port 12 can be achieved. Also, the shape of the outlet port 12 is not limited to this shape, and any shape that can blow a gas to the entire surface of the substrate 1 is suitable. For example, the outlet port 12 may have a width equal to a diameter of the substrate 1 in the Y axis direction and a gas may be blown from the outlet port 12 toward the substrate 1 in parallel (in the X direction).

The outlet port 12 is disposed, for example, on the first support portion 16 which is a position closer to the hand 11 than the rotation shaft 18. By disposing the outlet port 12 in this way, the outlet port 12 also rotates as the hand 11 rotates with respect to the second support portion 17. For this reason, even when the hand 11 rotates with respect to the second support portion 17, the relationship between a blowing direction of the gas blown from the outlet port 12 and the substrate 1 does not change. The outlet port 12 is desirably disposed at a position at which, when the hand 11 can rotate with respect to the conveying path 30, the outlet port 12 rotates with the rotation of the hand 11, so that the relationship between the blowing direction of the gas blown out from the outlet port 12 and the substrate 1 does not change.

The gas supply source 14 supplies a clean gas to the outlet port 12. An amount of the gas supplied from the gas supply source 14 may be controlled by the controller 400. Thus, the amount of the gas blown out from the outlet port 12 is controlled. The controller 400 may control a blowing amount on the basis of, for example, a conveying path and a conveying speed of the substrate. For example, the blowing amount may be increased when the substrate is being conveyed between the processing units and may be smaller in the processing units. Here, the blowing amount is an amount of a gas blown out from the outlet port 12 per unit time.

The clean gas supplied from the gas supply source 14 is controlled to be blown out and stopped by the control valve 20.

In the present embodiment, as an example, two outlet ports of a first outlet port 12U and a second outlet port 12L are disposed as shown in FIG. 3B. The first outlet port 12U is disposed above the processing target surface of the substrate 1 (the +Z direction side) and blows the gas toward the processing target surface of the substrate 1 in a first direction that is oblique to the processing target surface.

The first outlet port 12U blows the gas in the first direction to form an airflow 15U in the first direction. The airflow 15U blown out from the first outlet port 12U is, for example, a rectified airflow. Here, the rectification of the airflow may be realized by blowing the gas via a rectifier (not shown). As the rectifier, for example, an aggregate of thin tubes, a net, a filter, or the like may be used.

The second outlet port 12L is disposed on a side (the −Z direction side) downward from the surface of the substrate 1 opposite to the processing target surface and blows the gas toward the second surface of the substrate 1 in a second direction that is oblique to the second surface. Similarly to the first outlet port 12U, the second outlet port 12L also blows the gas in the second direction to form an airflow 15L in the second direction. The airflow 15L blown out from the second outlet port 12L is, for example, a rectified airflow.

Figure 4A:
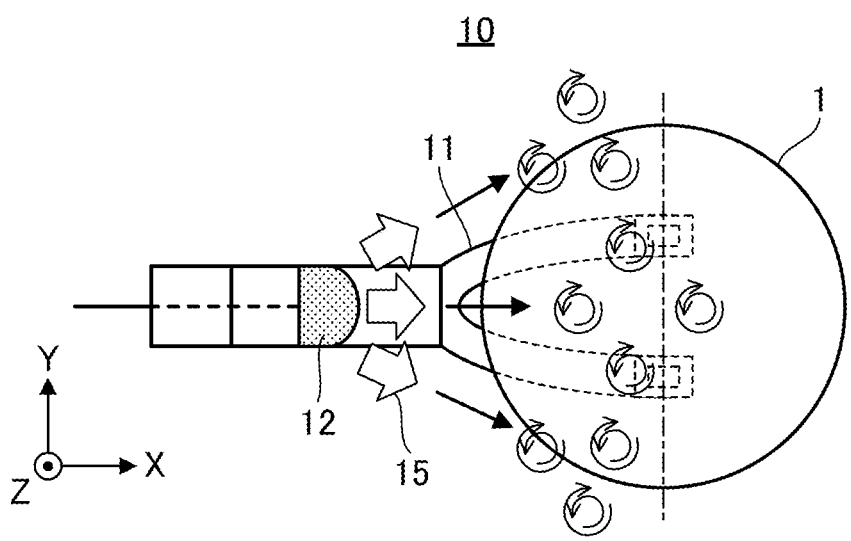
FIGS. 4A and 4B are diagrams illustrating a state of airflow when a gas is blown parallel to surfaces of a substrate.
Figure 4B:
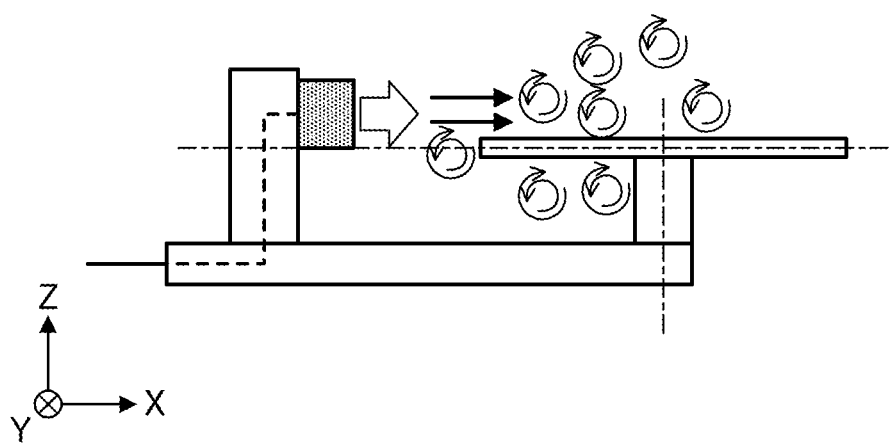

Here, a state of the airflow when the gas is blown parallel to surfaces of the substrate 1 will be described. FIG. 4A and FIG. 4B are diagrams illustrating a state of the airflow when the gas is blown parallel to the surfaces of the substrate 1. FIG. 4A is a plan view when the state of the airflow flowing on the processing target surface of the substrate 1 is viewed from the +Z direction. FIG. 4B is a side view when the state of the airflow flowing on the surfaces of the substrate 1 is viewed from the −Y direction. When the gas is blown parallel to the processing target surface of the substrate 1, as shown in FIGS. 4A and 4B, the airflow along the processing target surface and the surface opposite to the processing target surface of the substrate 1 becomes turbulence from a certain position and draws a surrounding atmosphere thereinto while diffusing. As a result, particles and the like existing in a conveying space may be drawn thereinto, which may result in adhesion of the particles and the like on the processing target surface of the substrate 1 and on a surface opposite to the processing target surface during conveyance of the substrate 1.

Figure 5A:
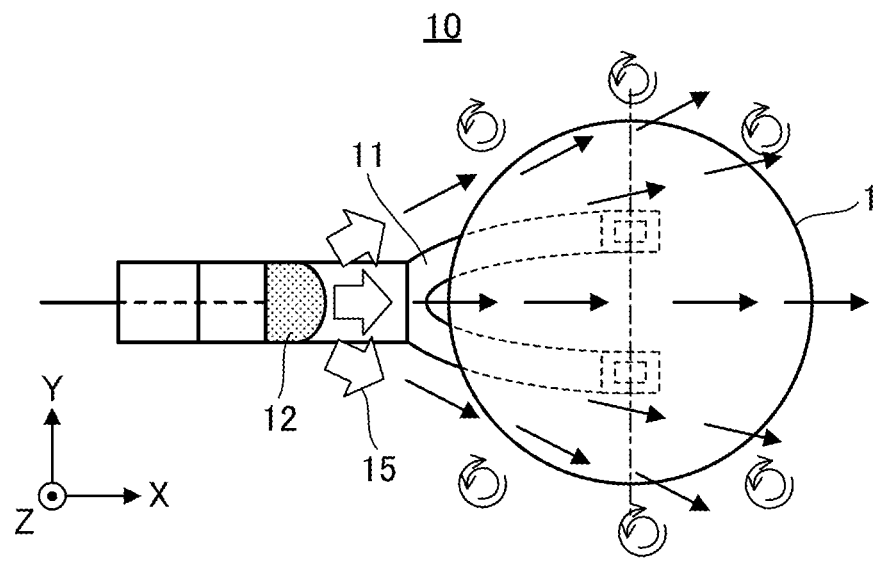
FIGS. 5A and 5B are diagrams illustrating a state of airflow blown to the surfaces of the substrate according to the first embodiment.
Figure 5B:
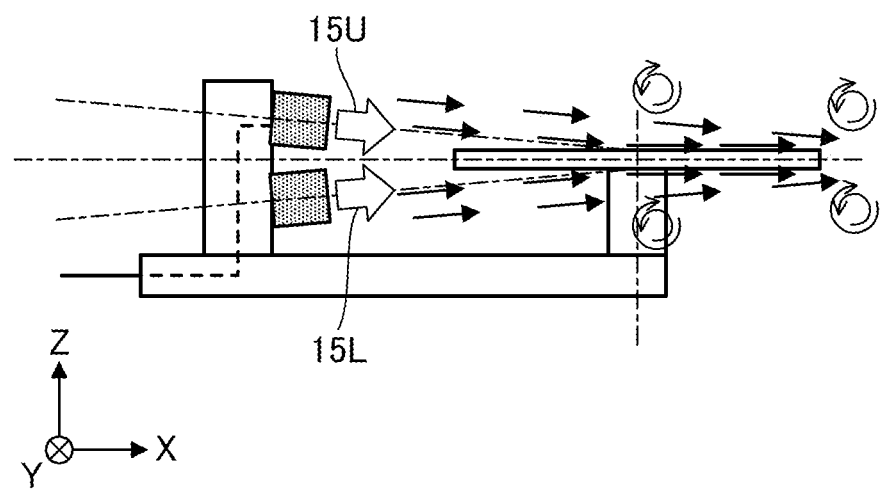

FIGS. 5A and 5B are diagrams illustrating a state of the airflow blown to the surfaces of the substrate 1 according to the first embodiment. FIG. 5A is a plan view when the state of the airflow flowing on the processing target surface of the substrate 1 according to the first embodiment is viewed from the +Z direction. FIG. 5B is a side view when the state of the airflow flowing on the surfaces of the substrate 1 according to the first embodiment is viewed from the −Y direction.

First, the blowing direction (first direction) of the first outlet port 12U will be described. The first outlet port 12U blows the rectified airflow 15U at a blowing angle θ1 to the processing target surface of the substrate 1 so that it can flow more air along the processing target surface of the substrate 1. For this reason, the airflow is not easily diffused and attenuated, and adhesion of the surrounding particles and the like to the substrate 1 can be reduced.

Returning to FIG. 3, as the blowing direction of the first outlet port 12U, first, an angle of the blowing direction of the first outlet port 12U is defined as θ1 as shown in FIG. 3B. Next, a thickness of the first outlet port 12U in a direction which is perpendicular to the processing target surface of the substrate 1 and is perpendicular to the blowing direction of the first outlet port 12U in a surface including the blowing direction of the first outlet port 12U is defined as T1, and a diameter of the substrate 1 is defined as D. Here, a conditional expression of $T1 \geq D \cdot \sin \theta 1$ is desirably satisfied. In this case, since the first outlet port 12U can blow the rectified gas to the entire surface of the processing target surface of the substrate 1 held by the holding unit 10, adhesion of particles and the like to the processing target surface can be reduced.

In addition, the first outlet port 12U desirably blows the gas to at least an outer periphery of the substrate 1 at a position most remote from the first outlet port 12U within the outer periphery of the substrate 1 held by the holding unit 10. The airflow 151U blown to the outer periphery at the position most remote from the first outlet port 12U inhibits turbulence from drawing the surrounding atmosphere even when the turbulence occurs on the processing target surface of the substrate 1. For this reason, adhesion of particles and the like to the processing target surface can be reduced.

Further, it is desirable that the blowing direction of the first outlet port 12U is a direction in which a straight line 152U that passes through a center of the first outlet port 12U and extends in the first direction is directed to a center C of the substrate 1. More desirably, it is desirable that the straight line 152U intersects the center C of the substrate 1. By doing so, it is possible to cope with a case in which a size of the substrate 1 changes.

Next, a blowing direction (second direction) of the second outlet port 12L will be described. The blowing direction of the second outlet port 12L can be set in the same manner as the first outlet port 12U. First, an angle of the blowing direction of the second outlet port 12L is defined as θ2. Next, a thickness of the second outlet port 12L in a direction which is perpendicular to the surface opposite to the processing target surface of the substrate 1 and is perpendicular to the blowing direction of the second outlet port 12L in a surface including the blowing direction of the second outlet port 12L is defined as T2, and a diameter of the substrate 1 is defined as D. Here, a conditional expression of $T2 \geq D \cdot \sin \theta 2$ is desirably satisfied. In this case, since the second outlet port 12L can blow the rectified gas over the entire surface opposite to the processing target surface of the substrate 1 held by the holding unit 10, adhesion of particles and the like on the surface opposite to the processing target surface can be reduced.

In addition, the second outlet port 12L desirably blows the gas to at least an outer periphery of the substrate 1 at a position most remote from the second outlet port 12L within the outer periphery of the substrate 1 held by the holding unit 10. The airflow 151L blown to the outer periphery at the position most remote from the second outlet port 12L inhibits turbulence from drawing the surrounding atmosphere even when the turbulence occurs on the surface opposite to the processing target surface of the substrate 1. For this reason, adhesion of particles and the like to the surface opposite to the processing target surface can be reduced.

Further, it is desirable that the blowing direction of the second outlet port 12L is a direction in which a straight line 152L that passes through a center of the second outlet port 12L and extends in the second direction is directed to the center C of the substrate 1. More preferably, it is desirable that the straight line 152L intersects the center C of the substrate 1. By doing so, it is possible to cope with a case in which the size of the substrate 1 changes.

Also, although an example in which two outlet ports, that is, the first outlet port 12U and the second outlet port 12L are disposed as the outlet ports 12 has been described in the present embodiment, the present invention is not limited to this example, and either one of them may be provided, or a larger number of them may be provided. Further, it is desirable that the gas blown out from the outlet port 12 is not blown to a side surface 19 of the substrate 1. By doing so, turbulence generated by blowing the gas to the side surface 19 of the substrate 1 can be inhibited.

Also, in the present embodiment, the conveyance unit 220 has been described as being controlled by the controller 400 of the processing system 100, but the conveyance unit 220 may have its own controller.

Second Embodiment

Figure 6A:
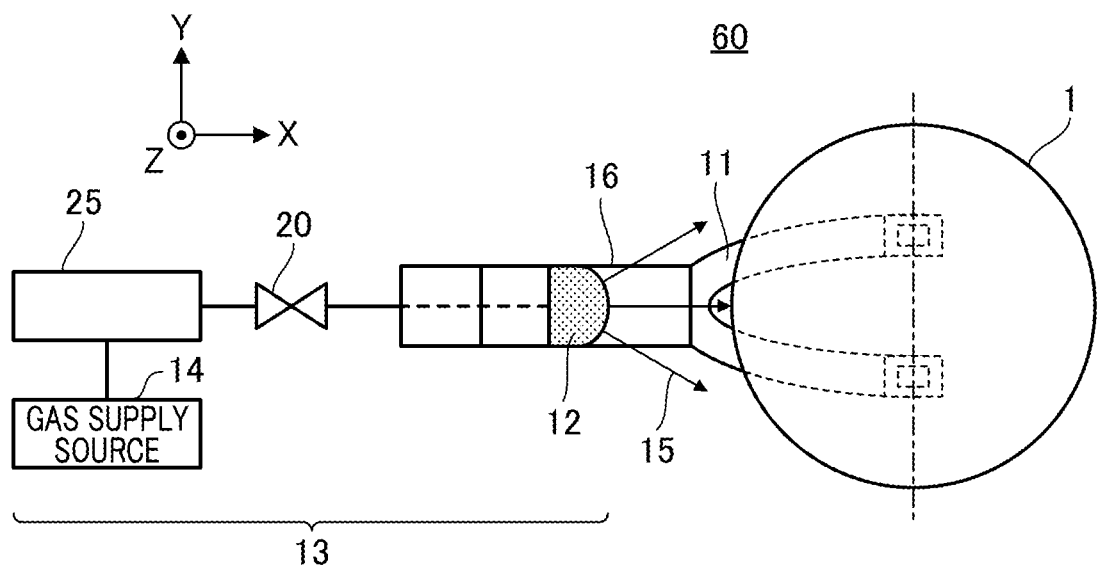
FIGS. 6A and 6B are schematic diagrams showing a configuration of a holding unit according to a second embodiment.
Figure 6B:
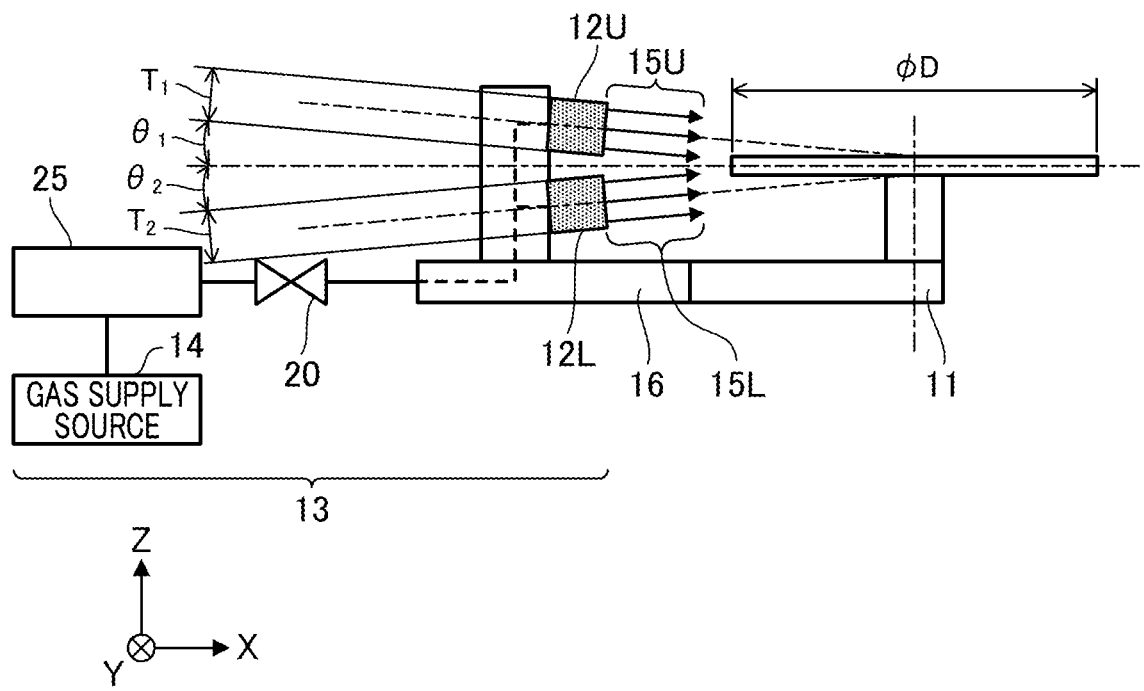

Next, a second embodiment will be described. Contents not mentioned in the second embodiment correspond to the above-described embodiment. FIGS. 6A and 6B are schematic diagrams showing a configuration of a holding unit 60 according to the second embodiment. FIG. 6A is a plan view when the holding unit 60 according to the second embodiment is viewed from the +Z direction, and FIG. 6B is a side view when the holding unit 60 according to the second embodiment is viewed from the −Y direction. The holding unit 60 includes a temperature adjustment unit 25.

The temperature adjustment unit 25 controls the temperature of the gas provided from the gas supply source 14 to a desired temperature. The temperature of the gas adjusted by the temperature adjustment unit 25 may be controlled by the controller 400, for example. Thus, the temperature of the gas blown out from the outlet port 12 is controlled. The controller 400 may control the temperature of the gas on the basis of, for example, a conveying path and a conveying speed of the substrate. For example, when the substrate 1 is at a high temperature due to the pre-processing performed by the pre-processing apparatus 300, the controller 400 may control the temperature of the gas to be lower than a temperature of the gas blown out when the temperature of the substrate 1 is a desired temperature.

According to the present embodiment, the substrate can be set to a desired temperature during the conveyance of the substrate, so that the productivity can be improved.

Third Embodiment

Figure 7A:
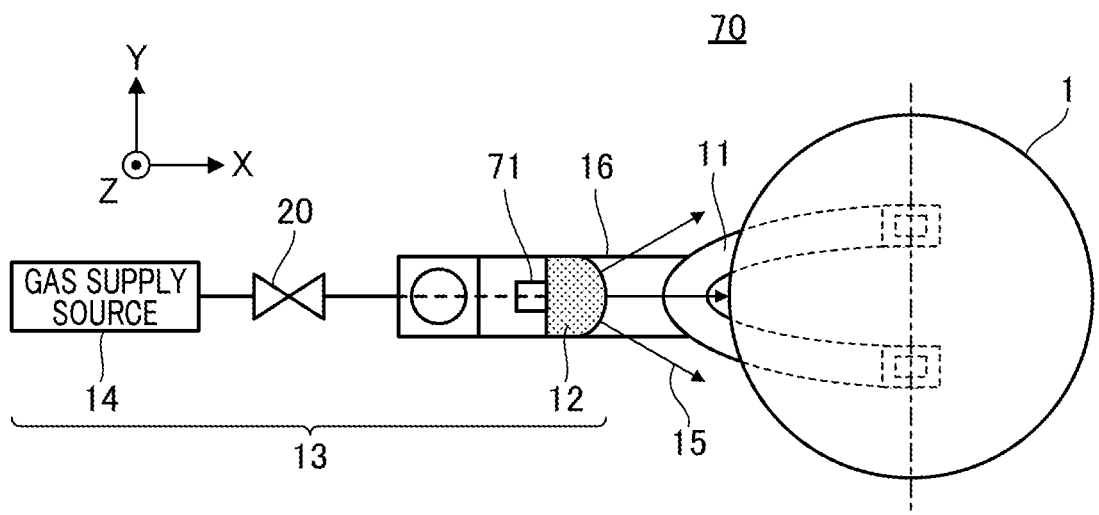
FIGS. 7A and 7B are schematic diagrams showing a configuration of a holding unit according to a third embodiment.
Figure 7B:
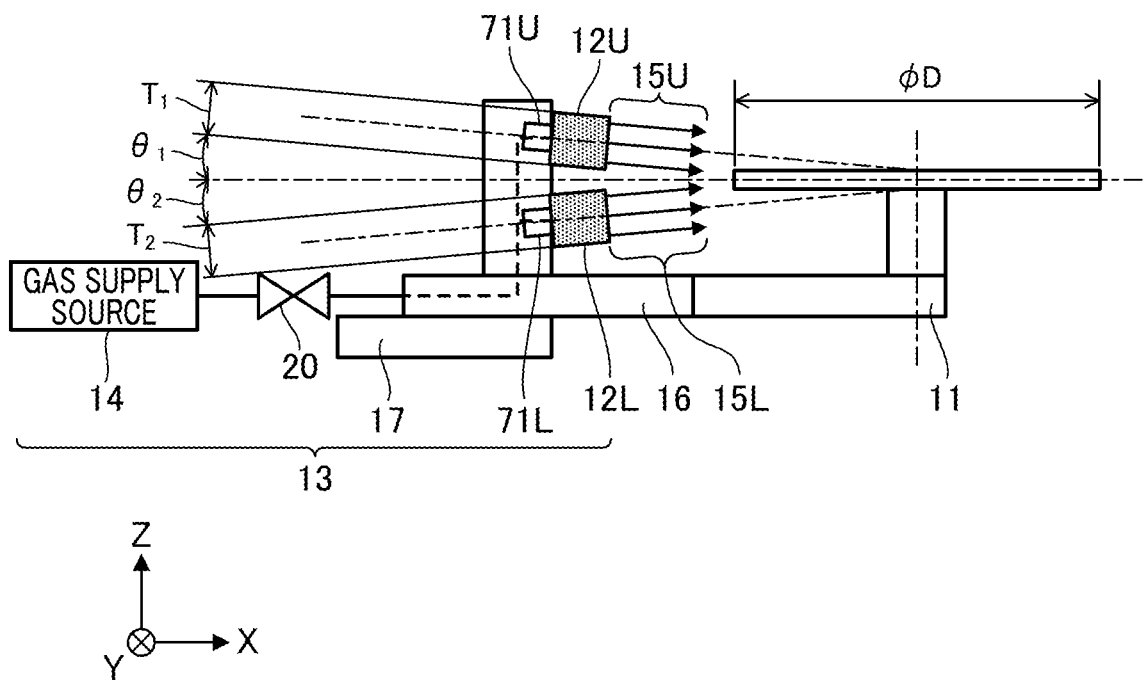

Next, a third embodiment will be described. Contents not mentioned in the third embodiment correspond to those in the embodiments described above. FIGS. 7A and 7B are schematic diagrams showing a configuration of a holding unit 70 according to the third embodiment. FIG. 7A is a plan view when the holding unit 70 according to the second embodiment is viewed from the +Z direction, and FIG. 7B is a side view when the holding unit 70 according to the second embodiment is viewed from the −Y direction. The holding unit 70 includes a first driving unit 71U and a second driving unit 71L.

The first driving unit 71U drives the first outlet port 12U in accordance with the size of the substrate 1 and changes the blowing direction of the first outlet port 12U. The second driving unit 71L drives the second outlet port 12L in accordance with the size of the substrate 1, and changes the blowing direction of the second outlet port 12L.

Figure 8:
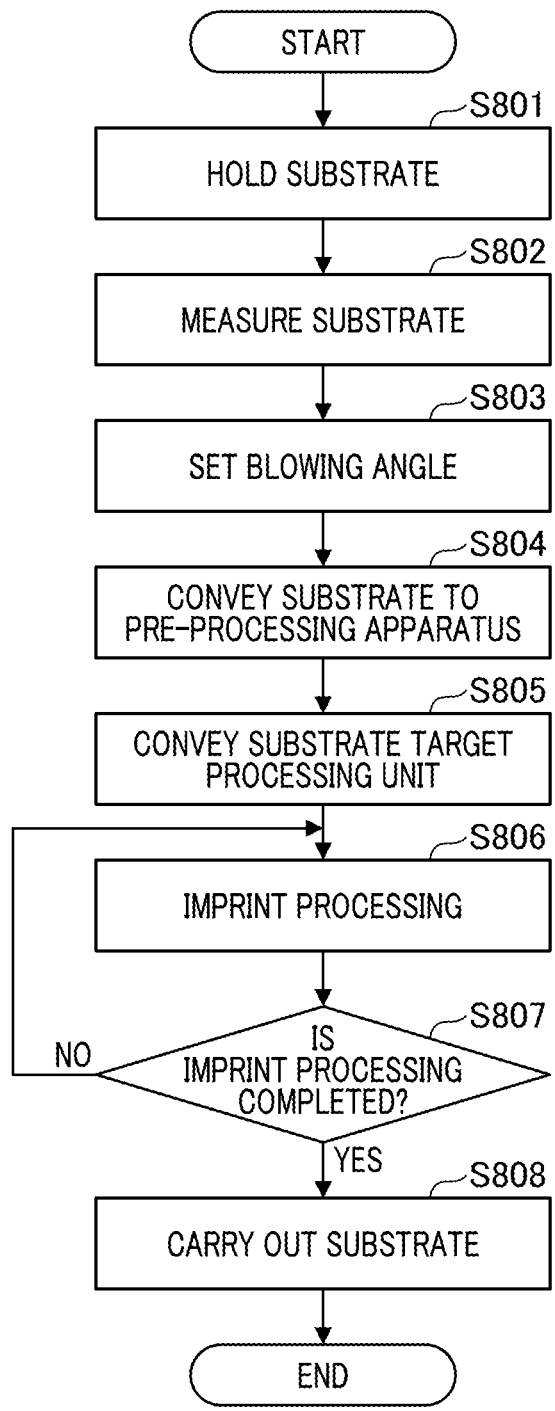
FIG. 8 is a flowchart showing an example of a main process according to the third embodiment.

FIG. 8 is a flowchart showing an example of a main process according to the third embodiment. Each flow is mainly executed by control of the controller 400 with respect to each unit. First, in S801, the holding unit 10 holds the substrate 1. Next, in S802, the size of the substrate 1, for example, the diameter of the substrate 1, is measured by a measurement unit (not shown) included in the processing system 100, for example. Also, in this case, the size of the substrate 1 measured in advance may be used.

In S803, the controller 400 sets the angle of the outlet port 12 in accordance with the size of the substrate 1. For example, the controller 400 calculates the blowing angle θ1 and the blowing angle θ2 that satisfy the conditional expressions described in the first embodiment and sets the calculated angles as the blowing angles. Also, for example, the controller 400 may have a storage unit that stores blowing angles corresponding to sizes of the substrate 1 and may set the blowing angles using information stored in the storage unit. Further, it is desirable that a user previously select blowing angles stored in the storage unit and set the selected angle as the blowing angles.

In S804, the holding unit 10 conveys the substrate 1 to the pre-processing apparatus 300. When the pre-processing apparatus 300 completes the preprocessing for the substrate 1, in S805, the holding unit 10 conveys the substrate 1 to a processing unit (a target processing unit) for processing the substrate 1 held by the holding unit 10 among the plurality of processing units 210. Thereafter, in S806, the substrate 1 is subjected to imprint processing in the target processing unit. When the imprint processing for the substrate 1 is completed (S807, YES), in S808, the holding unit 10 holds the substrate 1 again and carries out (conveys) the substrate 1. Also, after the imprint processing is completed in the target processing unit, the substrate may be conveyed to another processing unit, and the imprint processing may be further performed.

In the present embodiment, since the blowing direction of the outlet port can be changed in accordance with the size of the substrate, it is possible to more flexibly cope with substrates 1 of various sizes.

Embodiment of Article Manufacturing Method

An article manufacturing method according to the present embodiment is suitable for manufacturing an article such as a semiconductor device, a display apparatus, or an element having a fine structure. Examples of the article includes an electric circuit element, an optical element, a MEMS, a recording element, a sensor, a mold, or the like. Examples of the electric circuit element include a volatile or nonvolatile semiconductor memory such as a dynamic random access memory (DRAM), a static random access memory (SRAM), a flash memory, and a magnetic random access memory (MRAM), and a semiconductor element such as a large scale integration (LSI), a charge coupled device (CCD), an image sensor, and a field programmable gate array (FPGA). Examples of the mold include a mold for imprinting, etc. The article manufacturing method of the present embodiment includes a step of transferring an original pattern onto the substrate using a lithography apparatus (an exposure apparatus, an imprint apparatus, a drawing apparatus, etc.) on a photosensitive agent applied to the substrate, and a step of processing the substrate to which the pattern has been transferred in the above step. Further, the above manufacturing method includes other well-known processes (oxidation, film formation, vapor deposition, doping, planarization, etching, resist peeling, dicing, bonding, packaging, and the like). The substrate is made of glass, a ceramic, a metal, a semiconductor, a resin, or the like. If necessary, a member made of a material different from the substrate may be formed on a surface thereof. Specifically, examples of the substrate include a silicon wafer, a compound semiconductor wafer, quartz glass, etc.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-058566, filed Mar. 26, 2019, which is here by incorporated by reference wherein in its entirety.

What is claimed is:

1. A conveyance apparatus comprising:
    a holding unit configured to hold and convey a substrate; and
    an outlet unit disposed in the holding unit, the outlet unit including:
        a first outlet port configured to blow a gas in a first direction oblique to a first surface of the substrate held by the holding unit, toward the first surface; and
        a second outlet port configured to blow a gas in a second direction oblique to a second surface of the substrate, the second surface being opposite the first surface, toward the second surface.

2. The conveyance apparatus according to claim 1, wherein, when an angle of the first direction with respect to the first surface is defined as θ1, a thickness of the first outlet port in a direction which is perpendicular to the first surface and is perpendicular to the first direction in a surface including the first direction is defined as T1, and a diameter of the substrate is defined as D, a conditional expression of T1≥D·sin θ1 is satisfied.

3. The conveyance apparatus according to claim 1, wherein the holding unit is rotatable, and
the first outlet port is disposed to rotate with rotation of the holding unit and to blow the gas toward the first surface.

4. The conveyance apparatus according to claim 1, wherein, when an angle of the second direction with respect to the second surface is defined as θ2, a thickness of the second outlet port in a direction which is perpendicular to the second surface and is perpendicular to the second direction in a surface including the second direction is defined as T2, and a diameter of the substrate is defined as D, a conditional expression of T2≥D·sin θ2 is satisfied.

5. The conveyance apparatus according to claim 1, wherein the first outlet port blows the gas to at least an outer periphery at a position most remote from the first outlet port within the outer periphery of the substrate held by the holding unit.

6. The conveyance apparatus according to claim 1, further comprising a driving unit configured to change an angle of the first direction in accordance with a size of the substrate.

7. The conveyance apparatus according to claim 6, further comprising a storage unit configured to store the angle of the first direction corresponding to the size of the substrate,
wherein the driving unit is controlled to set the angle to an angle stored in the storage unit in accordance with the size of the substrate.

8. The conveyance apparatus according to claim 1, wherein the outlet unit includes a controller configured to control an amount of the gas blown out from the first outlet port.

9. The conveyance apparatus according to claim 8, wherein the outlet unit includes an adjusting unit configured to adjust a temperature of the gas blown out from the first outlet port.

10. The conveyance apparatus according to claim 9, wherein the controller controls the blowing amount or the temperature on the basis of a conveying path for conveying the substrate.

11. The conveyance apparatus according to claim 1, wherein the first direction is a direction from a center of the first outlet port to a center of the substrate held by the holding unit.

12. The conveyance apparatus according to claim 1, wherein the first outlet port blows the gas via a rectifier which regulates a flow of the gas.

13. A conveyance method for conveying a substrate held by a holding unit comprising:
a conveying step of conveying the substrate; and
a blowing step of blowing a gas in a first direction, which is a direction oblique to a first surface of the substrate held by the holding unit, toward the first surface, and in a second direction oblique to a second surface of the substrate, the second surface being opposite the first surface, toward the second surface, in the conveying step.

14. A lithography apparatus comprising:
a processing unit configured to form a pattern on a substrate conveyed by a conveyance apparatus, the conveyance apparatus including:
a holding unit configured to hold and convey the substrate; and
an outlet unit which is disposed in the holding unit and includes a first outlet port configured to blow a gas in a first direction, which is a direction oblique to a first surface of the substrate held by the holding unit, toward the first surface, and a second outlet port configured to blow a gas in a second direction oblique to a second surface of the substrate, the second surface being opposite the first surface, toward the second surface.

15. A lithography system for forming a pattern on a substrate, comprising:
a first processing apparatus and a second processing apparatus configured to process the substrate; and
a conveyance apparatus configured to convey the substrate from the first processing apparatus to the second processing apparatus,
wherein the conveyance apparatus includes:
a holding unit configured to hold and convey the substrate; and
an outlet unit which is disposed in the holding unit and includes a first outlet port configured to blow a gas in a first direction, which is a direction oblique to a first surface of the substrate held by the holding unit, toward the first surface, and a second outlet port configured to blow a gas in a second direction oblique to a second surface of the substrate, the second surface being opposite the first surface, toward the second surface.

16. An article manufacturing method comprising steps of:
forming a pattern on a substrate using a lithography apparatus for forming the pattern on the substrate;
processing the substrate on which the pattern is formed in the above step; and
manufacturing an article from the processed substrate,
wherein the lithography apparatus includes a processing unit which forms the pattern on the substrate conveyed by a conveyance apparatus including:
a holding unit which holds and conveys the substrate; and
an outlet unit which is disposed in the holding unit and includes a first outlet port configured to blow a gas in a first direction, which is a direction oblique to a first surface of the substrate held by the holding unit, toward the first surface, and a second outlet port configured to blow a gas in a second direction oblique to a second surface of the substrate, the second surface being opposite the first surface, toward the second surface.

\* \* \* \* \*